United States Patent [19]

Allen et al.

[11] Patent Number: 4,615,621

[45] Date of Patent: * Oct. 7, 1986

[54] AUTO-FOCUS ALIGNMENT AND MEASUREMENT SYSTEM AND METHOD

[75] Inventors: David L. Allen, Cupertino; Tor G. Larsen, Saratoga, both of Calif.

[73] Assignee: Eaton Corporation, Cleveland, Ohio

[*] Notice: The portion of the term of this patent subsequent to Apr. 8, 2003 has been disclaimed.

[21] Appl. No.: 364,681

[22] Filed: Apr. 2, 1982

[51] Int. Cl.[4] .............................................. G01B 11/00
[52] U.S. Cl. ..................... 356/399; 356/400
[58] Field of Search ............. 356/123, 399, 400, 401; 250/201; 350/415, 453, 6.3, 6.1; 353/35

[56] References Cited

U.S. PATENT DOCUMENTS

| | | | |
|---|---|---|---|
| 2,552,238 | 5/1951 | Turner | 350/415 |
| 3,191,490 | 6/1965 | Rabinow | 353/35 |
| 3,709,579 | 1/1973 | Makosch | 356/399 |
| 3,896,304 | 7/1975 | Aoki et al. | 250/201 |
| 3,901,597 | 8/1975 | White | 356/123 |
| 3,974,327 | 8/1976 | Van Dijk | 178/6.6 R |
| 4,070,116 | 1/1978 | Frosch et al. | 356/372 |
| 4,127,777 | 11/1978 | Binder | 250/548 |
| 4,133,606 | 1/1979 | Hosoe et al. | 250/201 |
| 4,140,392 | 2/1979 | Lacombat et al. | 355/56 |
| 4,200,393 | 4/1980 | Suzuki et al. | 356/400 |
| 4,243,848 | 1/1981 | Utsumi | 369/45 |
| 4,247,203 | 1/1981 | Levy et al. | 356/399 |
| 4,329,577 | 5/1982 | Asano et al. | 250/201 |
| 4,354,103 | 10/1982 | Immink et al. | 250/201 |

FOREIGN PATENT DOCUMENTS 13330 1/1979 Japan .................................. 356/123

Primary Examiner—R. A. Rosenberger
Attorney, Agent, or Firm—Roland I. Griffin

[57] ABSTRACT

An auto-focusing alignment and measurement system for use in precisely positioning a semiconductor substrate with respect to an integrated circuit mask is herein disclosed. This system includes a moveable convergent lens operable with another pair of convergent lenses for alternately focusing images of the mask and the substrate onto a photodiode array. The photodiode array serves as a focus detector and, together with associated signal processing circuitry, provides a feedback signal for controlling displacement of the moveable lens to equal the separation between the mask and the substrate with an accuracy better than the depth of field of the optics. An illumination source and viewing optics provide a magnified view of images of both the mask and the substrate superimposed and in focus, thereby facilitating alignment of the substrate with respect to the mask prior to photolithographic printing. This apparatus may also be employed to measure the degree of surface flatness and parallelism between the mask and the substrate and the dimensions of surface features.

29 Claims, 10 Drawing Figures

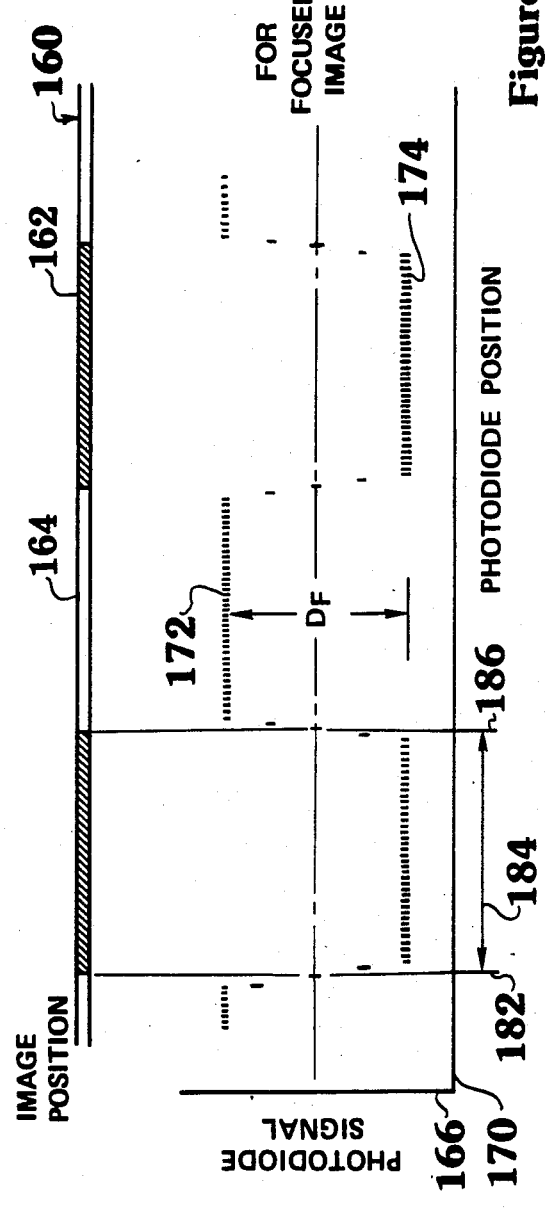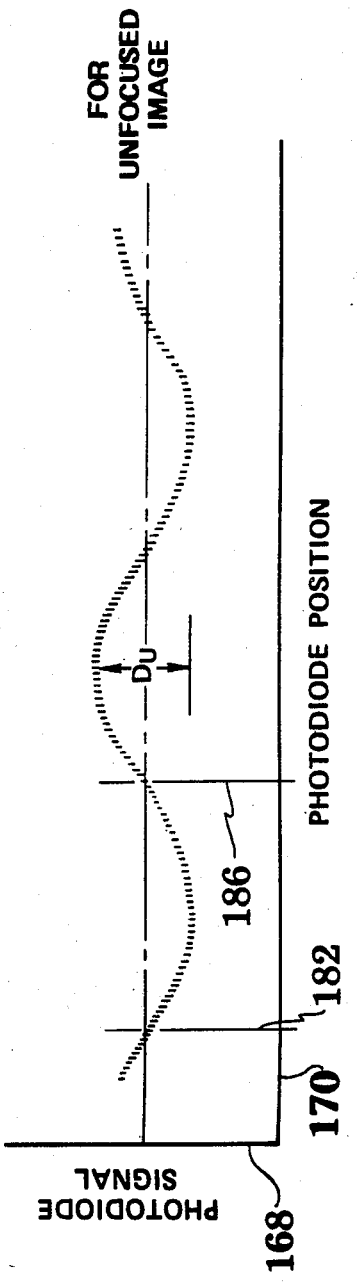
Figure 5a
Figure 5b

AUTO-FOCUS ALIGNMENT AND MEASUREMENT SYSTEM AND METHOD

CROSS-REFERENCE TO RELATED APPLICATION

The subject matter of the present patent application is related to that of copending U.S. patent application Ser. No. 364,680 entitled AUTO-FOCUS ALIGNMENT AND MEASUREMENT SYSTEM AND METHOD, filed on Apr. 2, 1982, by Tor G. Larsen, and assigned to the same assignee as the present patent application.

BACKGROUND OF THE INVENTION

This invention relates generally to optical focusing, aligning, and measuring systems and methods, and more specifically to such optical systems and methods for use in the fabrication of semiconductor integrated circuits.

Integrated circuits are electronic devices that are fabricated from a wafer of semiconductor material, such as silicon, by subjecting the wafer to a series of processing steps. The wafer, or substrate, is coated with a light-sensitive or photoresist material and then aligned with respect to a mask which allows light to expose the photoresist material in accordance with a predetermined circuit pattern. This pattern is subsequently used for developing circuit elements employed in forming the integrated circuits. Circuit patterns are thus transferred to the wafer photolithographically, with several different masks being used to form a typical integrated circuit. Successive wafer alignments with respect to the masks are critical to insure functional integrated circuits.

Proximity or out-of-contact printing, where the mask and the wafer are separated by a small gap (typically in the ten micrometer to fifty micrometer range), is a popular integrated circuit fabrication technique. Process yields using proximity or out-of-contact printing are better than those attainable using contact printing because of reduced mask impairment and improved mask lifetime due to the absence of contact between the mask and the wafer during printing. The proximity or out-of-contact method of printing is also the only method that can be used in X-ray lithography.

Proximity or out-of-contact printing is not without problems, however, because the gap separating the mask and the wafer must be great enough to allow for the surface flatness tolerances in both the mask and the wafer, but small enough to minimize diffraction effects on the projected circuit pattern. Integrated circuits are commonly designed with circuit pattern details which require alignment tolerances in the submicrometer range. Magnification optics of 100× to 1000× are commonly used in aligning the wafer with respect to the mask to resolve the alignment to the required tolerances, but such high magnification optics with high numerical apertures have a depth of field that is less than the gap separating the mask and the wafer. This means that either the mask or the wafer, but not both, can be in focus at any one time, thereby causing great difficulty in positioning the wafer for proper alignment with respect to the mask.

Thus, an optical system is needed that is capable of simultaneously displaying to an operator a magnified and focused view of both a mask and an out-of-contact wafer to facilitate mask-wafer alignment. A measurement system is further needed that is capable of measuring and adjusting the gap separating the mask and the wafer to a value suitable for proximity or out-of-contact printing and that is also capable of measuring line widths and other surface features of the mask or the wafer. In addition, an alignment system is needed that is capable of more precisely aligning the wafer with respect to the mask.

Optical methods for focusing on two planes separated by more than the depth of field of the optics exist in the prior art. U.S. Pat. Nos. 3,488,104, 3,709,579, and 3,990,798 all disclose dual focus apparatus utilizing optical compensators that are fabricated for a specific gap value. However, these compensators are not easily adjustable to accomodate a range of gap values.

A gap measurement device is shown in U.S. Pat. No. 4,165,178, but this device is a go/no-go optical gauge that is limited to sensing separation distance at edges only. The use of a single moveable converging lens to measure the gap between a mask and a wafer is described in U.S. Pat. No. 4,070,116. However, careful study of this patent reveals problems that are inherent in the use of a single moveable converging lens for gap measurement.

The governing optics equation states that the reciprocal of the focal length of a lens equals the sum of the reciprocals of the object distance and the image distance. Since the focal length of a lens is constant, an increase in the image distance is balanced by a decrease in the object distance. In U.S. Pat. No. 4,070,116 the moveable lens is employed with a fixed focus detector to measure the gap between the mask and the wafer. After focusing an image of the mask onto the focus detector, the lens is moved away from the focus detector to a position at which the lens focuses an image of the wafer onto the focus detector. This displacement or change of position of the lens increases the image distance from the lens to the focus detector and causes a corresponding decrease in the object distance from the lens to the object plane. Due to this decrease in the object distance, the lens displacement must be greater than the gap between the mask and the wafer. The gap measurement calculation described in U.S. Pat. No. 4,070,116 therefore is quite complex and requires knowledge of the mask image distance and the mask object distance as well as the lens displacement. Moreover, U.S. Pat. No. 4,070,116 discloses no provision for establishing measurement accuracy greater than the depth of field of the optics.

Focus detectors sensing light intensity variations are also known to exist in the prior art. See, for example, U.S. Pat. Nos. 3,356,854 and 4,070,116, which show optical fibers attached to photodetectors and signal conditioning circuitry.

SUMMARY OF THE INVENTION

It is an object of this invention to provide imaging apparatus with an arrangement of lenses, one of which is moveable along its optical axis, for focusing images of different surfaces by positioning the focal plane of the moveable lens alternately at those surfaces.

Another object of this invention is to provide apparatus capable of measuring the gap between a mask and a substrate by measuring the displacement of a moveable lens that alternately focuses on a surface of the mask and on a surface of the substrate.

Another object of this invention is to provide apparatus and a method for positioning a substrate at a location parallel to a mask and spaced a predetermined distance from the mask.

Another object of this invention is to provide apparatus for optically measuring the flatness of a surface.

A further object of this invention is to provide imaging apparatus and a method for simultaneously providing a magnified and focused view of a mask and a substrate that are separated by more than the depth of field of the imaging optics.

A further object of this invention is to provide imaging apparatus for simultaneously displaying magnified and focused views of two laterally-spaced areas of both a mask and a substrate when the mask and the substrate are separated by more than the depth of field of the imaging optics.

Still a further object of this invention is to provide an improved focus detector comprising an array of photodiodes for allowing measurement of surface features of a mask or a substrate, as well as focus detection of a surface of the mask or the substrate.

These and other objects, which will hereinafter become apparent, are accomplished in accordance with the illustrated preferred embodiment of this invention by providing an autofocusing optical alignment and measurement system for more efficiently and precisely aligning a semiconductor wafer or substrate with respect to an out-of-contact or spaced-apart mask containing microcircuitry features to be photolithographically or X-ray transferred to the substrate. This system includes an arrangement of lenses, one of which is a moveable convergent lens, for alternately focusing images of the mask and the substrate onto a photodiode array. The photodiode array, with its associated signal processing circuitry, serves as a focus detector. Control apparatus using the focus detector to provide a feedback signal, adjusts the displacement of the moveable lens to equal the separation or gap between the mask and the substrate with an accuracy better than the depth of field of the optics of the system. The moveable lens alternately focuses on the mask and substrate at a rate faster than the response rate of human vision. Microscope viewing optics and a strobe light, timed to flash when either the mask or the substrate is focused, allow an operator to see a magnified view of both the mask and the substrate superimposed and in focus.

The system can also be employed to measure surface flatness of either the mask or the substrate. In addition, the degree of parallelism between the mask and the substrate can be measured. Substrate positioning apparatus allows the operator to adjust the separation or gap between and the alignment and parallelism of the mask and the substrate prior to photolithographic printing.

In an alternate embodiment of the invention, two separate sets of imaging optics are provided to permit viewing of a split-field image of separate laterally-spaced areas of both the mask and the substrate. This capability simplifies the alignment procedure, which can then be performed while simultaneously viewing those areas.

DESCRIPTION OF THE DRAWINGS

FIGS. 5a and 5b are diagrams illustrating how the photodiode array of the system of FIG. 1 serves as a focus detector.

DESCRIPTION OF THE PREFERRED EMBODIMENTS

Figure 1:
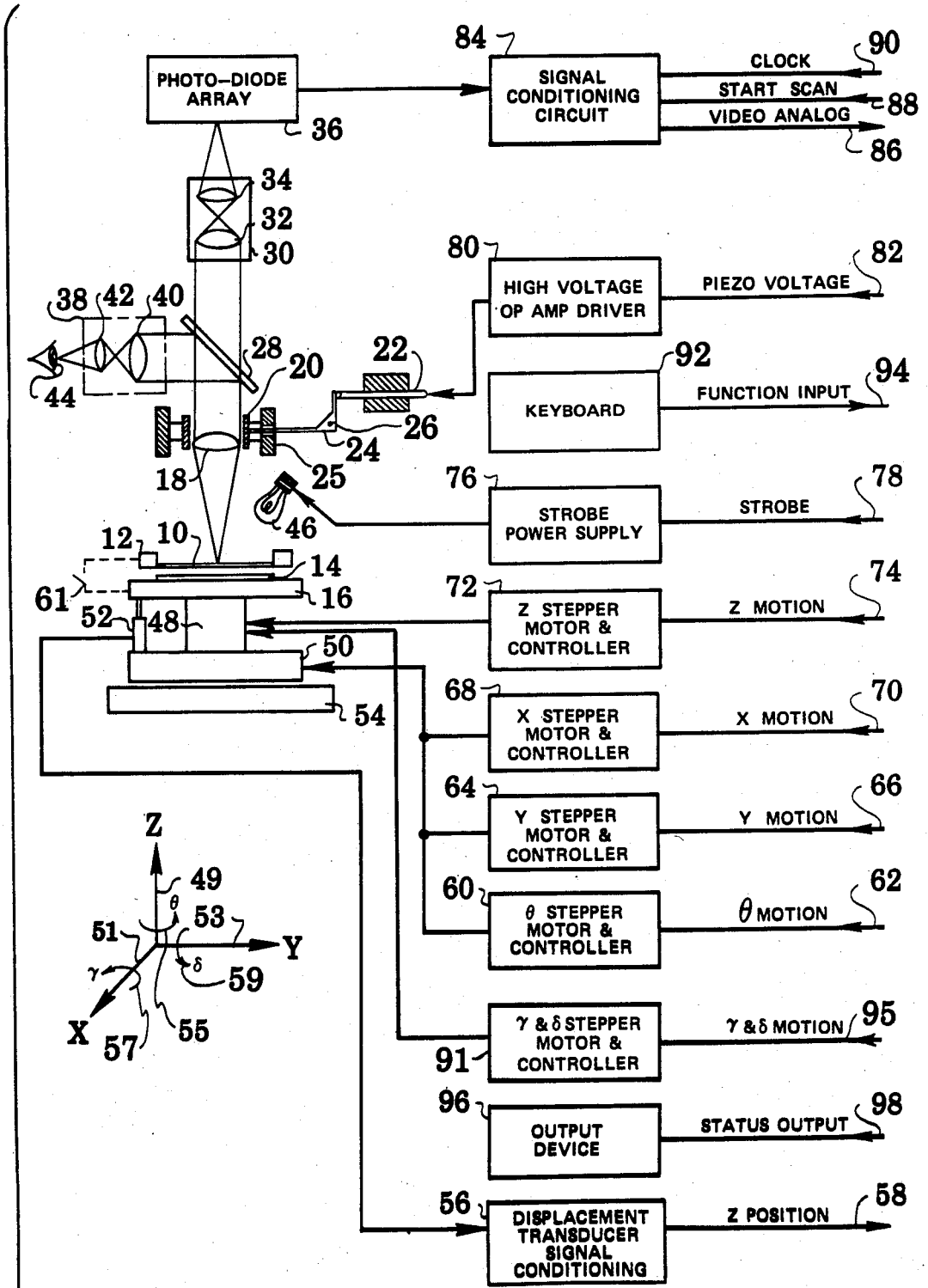
FIG. 1 is a schematic diagram of an auto-focusing optical alignment and measurement system according to the preferred embodiment of this invention and of a control function interface therefor.
Figure 2:
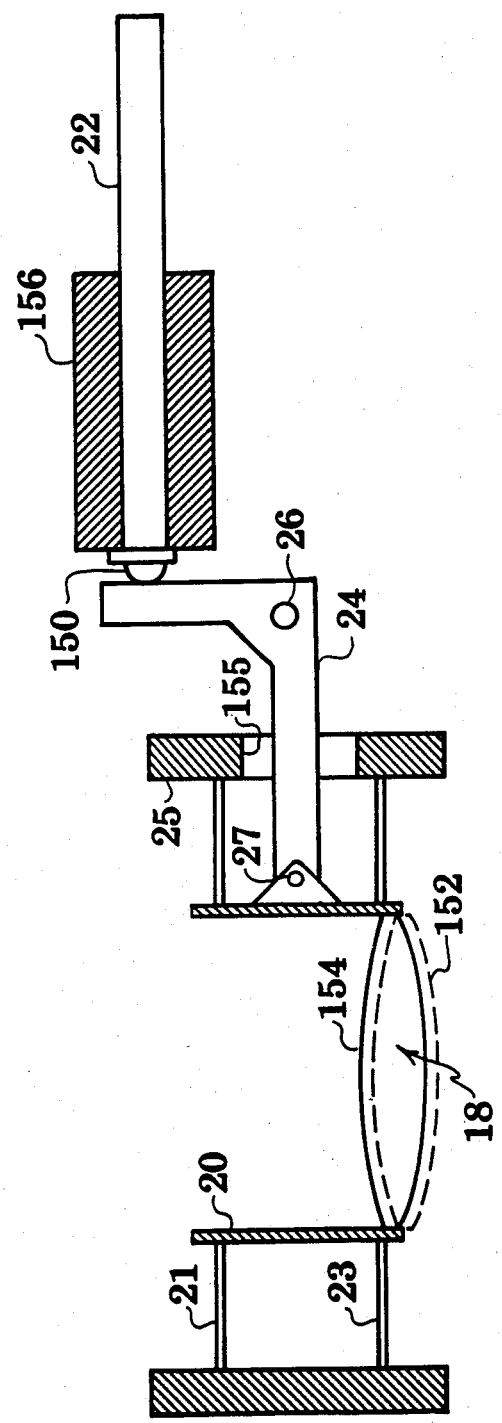
FIG. 2 is a more detailed schematic diagram of the mechanism for oscillating the moveable lens of the system of FIG. 1.

Referring to FIG. 1, there is shown an auto-focusing alignment and measurement system according to the preferred embodiment of this invention. In this system a photolithographic mask 10 is held by a mask frame 12 and is positioned above a semiconductor substrate 14 that is in turn mounted on a substrate holder 16. A moveable, convergent objective lens 18 is attached to a lens frame 20 and is positioned by a piezoelectric transducer 22 acting on a lever 24 that pivots about a pivot point 26. As shown in FIG. 2, the motion of the moveable lens 18 is bounded by an upper position 154 and a lower position 152. The moveable lens 18, attached to the lens frame 20, is guided by two flexures 21 and 23 attached to a housing 25. These flexures 21 and 23 permit movement of the lens 18 between the upper position 154 and the lower position 152, but constrain lens motion in all other directions. The flexures 21 and 23 also act as springs to keep the lever 24 in contact with a transducer plunger 150 of the piezoelectric transducer 22, which is mounted in a transducer support 156. The lever 24 passes through a clearance hole 155 in the housing 25 and is fastened to the lens frame 20 at a lever attachment point 27.

Figure 3:
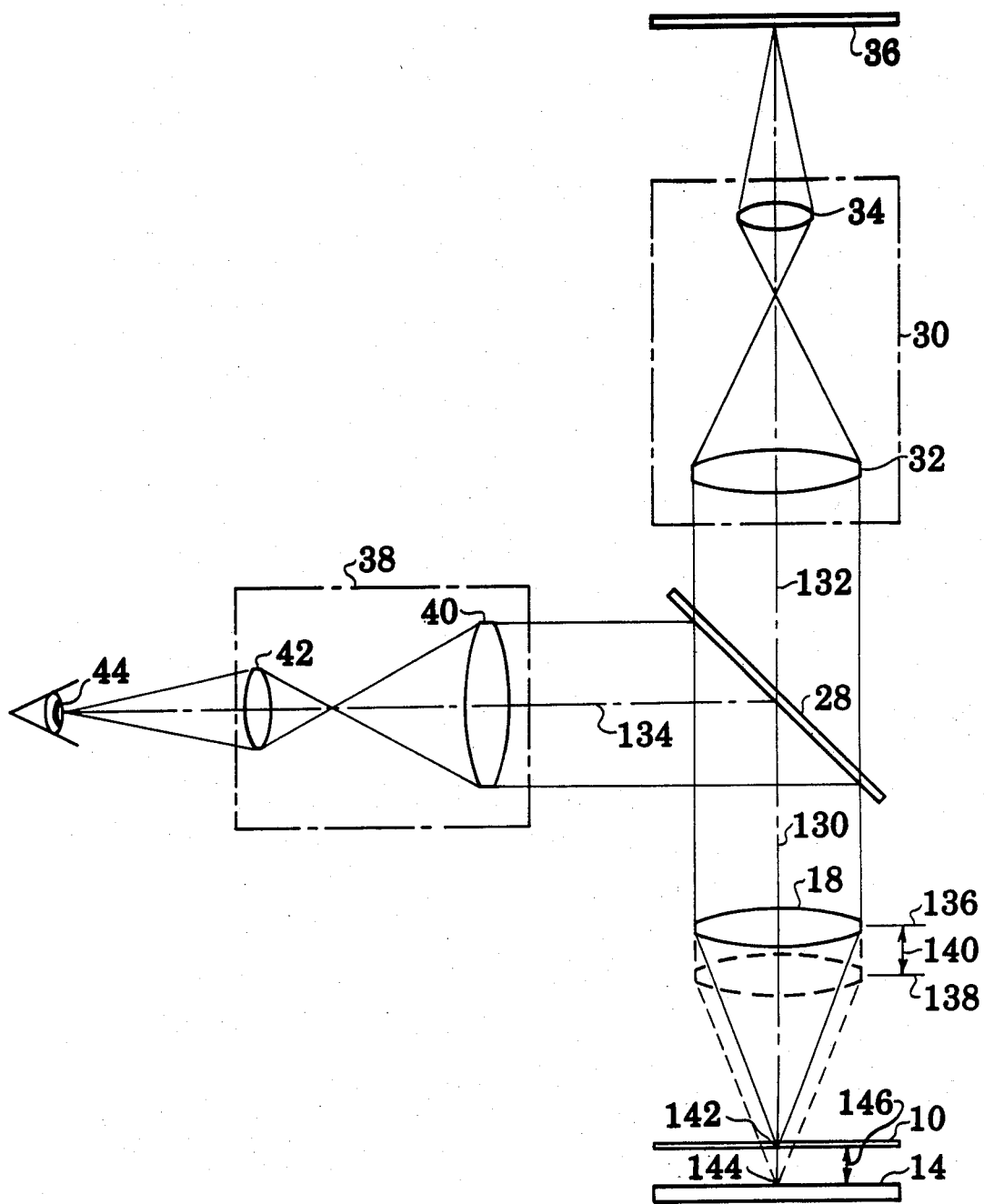
FIG. 3 is a schematic diagram of the optical portion of the system of FIG. 1 illustrating the positioning and motion of the moveable lens in greater detail.

Referring now to FIG. 3, the moveable lens 18 is shown in solid lines at a mask focus position 136 where its focal point 142 is coincident with the lower surface of the mask 10. The moveable lens 18 is shown in dotted lines at a substrate focus position 138 where its focal point 144 coincides with the upper surface of the substrate 14, which is separated from the mask 10 by a gap 146. A displacement 140 of the moveable lens 18 from the mask focus position 136 to the substrate focus position 138 is equal to the gap 146 between the mask 10 and the substrate 14.

The moveable lens 18 is disposed along a vertical focusing lens optical path 132 coincident with the optical axis 130 of the moveable lens. A beam splitter 28 is disposed along this vertical optical path 132 above the moveable lens 18 to provide a horizontal viewing lens optical path 134. A focusing lens assembly 30, which contains a convergent transfer lens 32 and a convergent focusing lens 34, is disposed along the vertical optical path 132 above the beam splitter 28 to focus a magnified image of the mask 10 or the substrate 14 onto a photodiode array 36 disposed along the same optical path above the focusing lens assembly. The photodiode array serves as a focus detector. A viewing lens assembly 38, which contains a convergent transfer lens 40 and a convergent focusing lens 42, is disposed along the horizontal viewing lens optical axis 134 to present a focused and magnified image of the mask 10 or the substrate 14 to an observer 44.

Referring back to FIG. 1, the substrate holder 16 is mounted on a chuck 48 that is capable of translational movement perpendicular to the plane of the mask 10 in a Z direction 49 and also capable of rotational movement in $\gamma$ and $\delta$ directions 57 and 59 about orthogonal X and Y axes, respectively. The chuck 48 is mounted on a stage 50 translatable in X and Y directions 51 and 53, respectively, and rotatable in a $\theta$ direction 55 about a Z axis, all in a plane parallel to the mask 10. Motion of the substrate holder 16 in the Z direction is monitored by a displacement transducer 52 electrically connected to a displacement transducer signal conditioning unit 56, which provides a Z position output signal 58. The position of the substrate 14 is controlled by a digital computer 99 (see FIG. 4) through a series of stepper motors and controllers. Stage 50 is rotated in the 8 direction 55 by a $\theta$ stepper motor and controller 60 in response to a $\theta$ motion signal 62 and is translated in the X and Y directions 51 and 53 by X and Y stepper motors and controllers 68 and 64 which respond to X and Y motion signals 70 and 66, respectively. The chuck 48 is moved in the Z direction 49 by a Z stepper motor and controller 72 in response to a Z motion signal 74 and is moved in the $\gamma$ and $\delta$ directions 57 and 59 by a $\gamma$ and $\delta$ stepper motor and controller 91 in response to $\gamma$ and $\delta$ motion signals 95.

A strobe light 46 is provided for illuminating the mask 10 and the substrate 14. A strobe power supply 76 is coupled to the strobe light 46 for causing the strobe light to flash in response to a strobe signal 78. Alternatively, a pulsed light source could be provided by employing a constant light source and a chopping device, such as a tuning fork or rotating disk with a window.

The piezoelectric transducer 22 for moving the lens 18 is driven by a high voltage operational amplifier driver 80 in response to a piezo voltage signal 82. Alternatively, lens motion could be provided by an electromagnetic transducer, such as a voice coil.

Each photodiode in the photodiode array 36 is connected to a signal conditioning circuit 84. Upon receipt of a start scan signal 88, the signal conditioning circuit 84 scans the voltage output signal from each photodiode at a scan rate determined by a clock signal 90. The signal conditioning circuit 84 converts these photodiode signals to a video analog signal 86 indicative of the pattern of the light impinging on the photodiode array 36.

The operator chooses the operational mode of the alignment and measurement apparatus via a keyboard 92 coupled to the digital computer 99 (see FIG. 4) for supplying a function input signal 94 thereto. The digital computer 99 in turn communicates with the operator via an output device 96 controlled by a status output signal 98. In the preferred embodiment of the invention the output device 96 is a cathode ray tube display.

Figure 4:
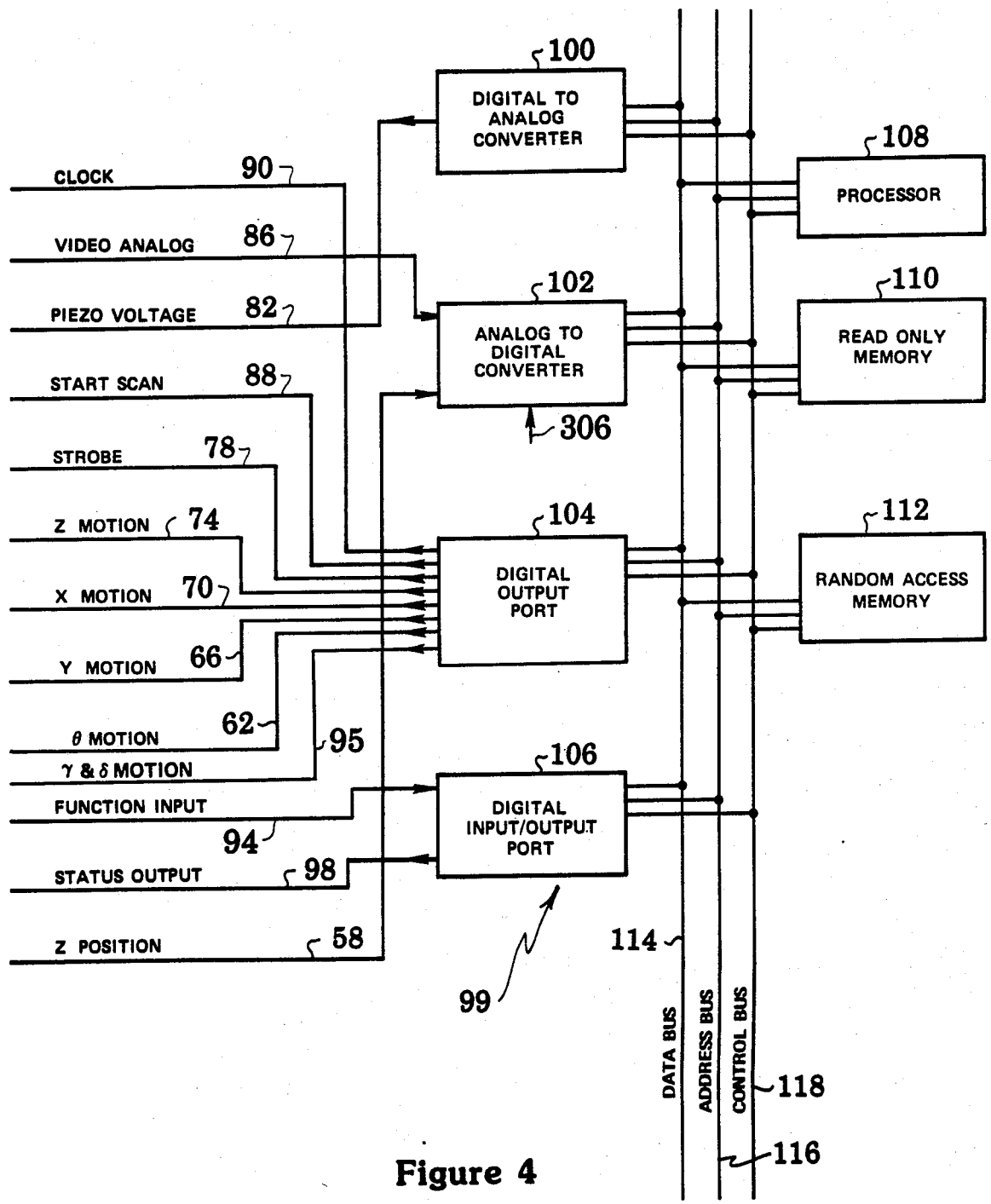
FIG. 4 is a schematic diagram of a computer and associated interfacing employed with the system of FIG. 1.

Referring now to FIG. 4, the digital computer 99 and its associated interfacing provide four primary control functions, namely: focus detection, moveable lens positioning, strobe flashing, and substrate positioning. Instructions for carrying out these control functions are stored in a read-only memory (ROM) 110. A processor 108 executes the instructions stored in the ROM 110 and uses a random-access memory (RAM) 112 for data storage. A digital to analog converter 100, an analog to digital converter 102, a digital output port 104, and a digital input/output port 106 are connected to the processor 108, the ROM 110, and the RAM 112 via a data bus 114, an address bus 116, and a control bus 118 in a manner well known in the art to provide interfacing for effecting the control functions.

The focus detection control function will now be explained with reference to FIGS. 1, 5a and 5b together with FIG. 4. An image 160 of the mask 10 or the substrate 14, as seen by the photodiode array 36, is composed of areas of relatively bright light 164 and relatively dim light 162 corresponding to surface features on the mask 10 or the substrate 14. Each photodiode in the photodiode array 36 generates a voltage output signal that is proportional to the intensity of light impinging on it. Such photodiode signals for an image 160 in focus and out of focus are shown plotted verses photodiode position 170 in FIGS. 5a and 5b, respectively. In either case, photodiodes in a bright area produce a high signal 172 while photodiodes in a dim area produce a low signal 174. These high and low signals 172 and 174 bound a differential signal. When the image 160 is in focus, the photodiode signal strength 166 at boundaries 182 and 186 has a maximum signal transition rate, and the differential signal has a maximum amplitude $D_F$. In contrast, when the image 160 is out of focus, the photodiode signal strength 168 at boundaries 182 and 186 has a smaller signal transition rate, and the differential signal has a smaller amplitude $D_U$.

In operation, the digital computer 99 provides the focus detection control function by first supplying the start scan signal 88 and the clock signal 90 at the digital output port 104 and then analyzing the video analog signal 86 as converted by the analog to digital converter 102. The image 160 is in focus when the aforementioned differential signal has a maximum amplitude or when the signal transition rate at the boundaries 182 and 186 is at a maximum. At this point the width 184 of a surface feature of the mask 10 or the substrate 14 can be measured.

With reference now to both FIGS. 3 and 4, the digital computer 99 controls the position of the moveable lens 18 by controlling the magnitude of the piezo voltage signal 82. In order to measure the gap 146 between the mask 10 and the substrate 14 (this gap being equal to the lens displacement 140) the mask focus position 136 and the substrate focus position 138 must be determined to a high degree of accuracy. Simply focusing the moveable lens 18 on the mask 10 or the substrate 14 would provide a lens position 136 or 138 accurate within the depth of field of the optics of the alignment and measurement apparatus. However, a much higher accuracy is required and is achieved by determining the center of the depth of field of the optics.

Figure 6:
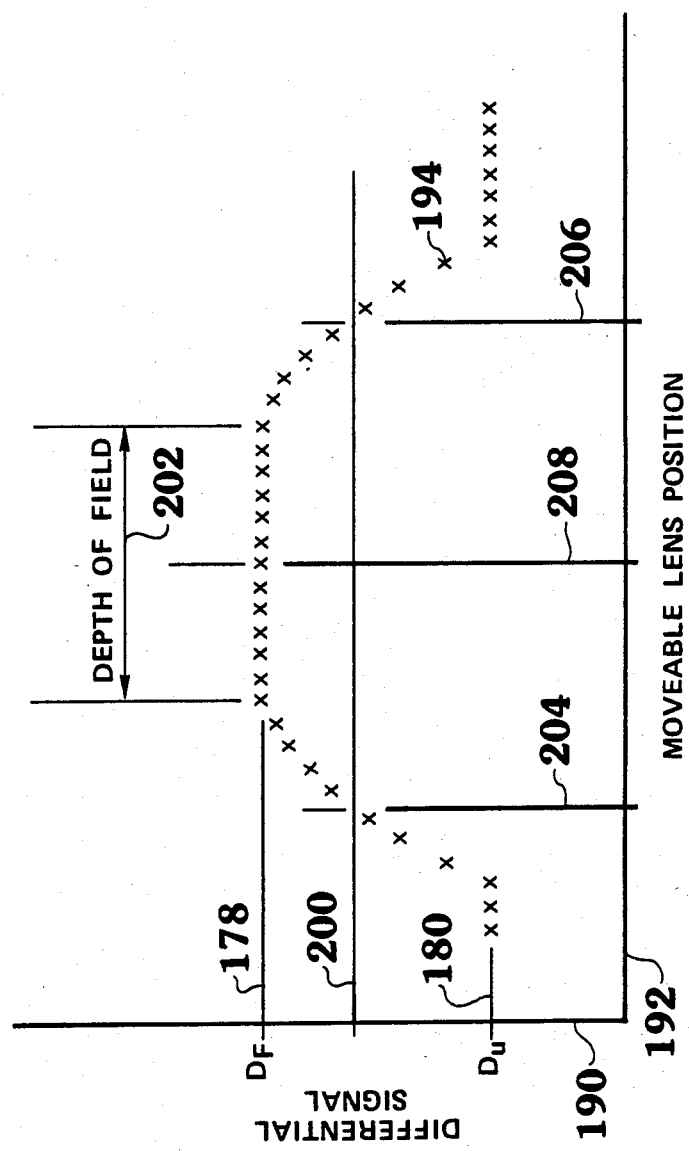
FIG. 6 is a diagram illustrating how the system of FIG. 1 determines the center of the depth of field of the optical portion of the system.
Figure 7:
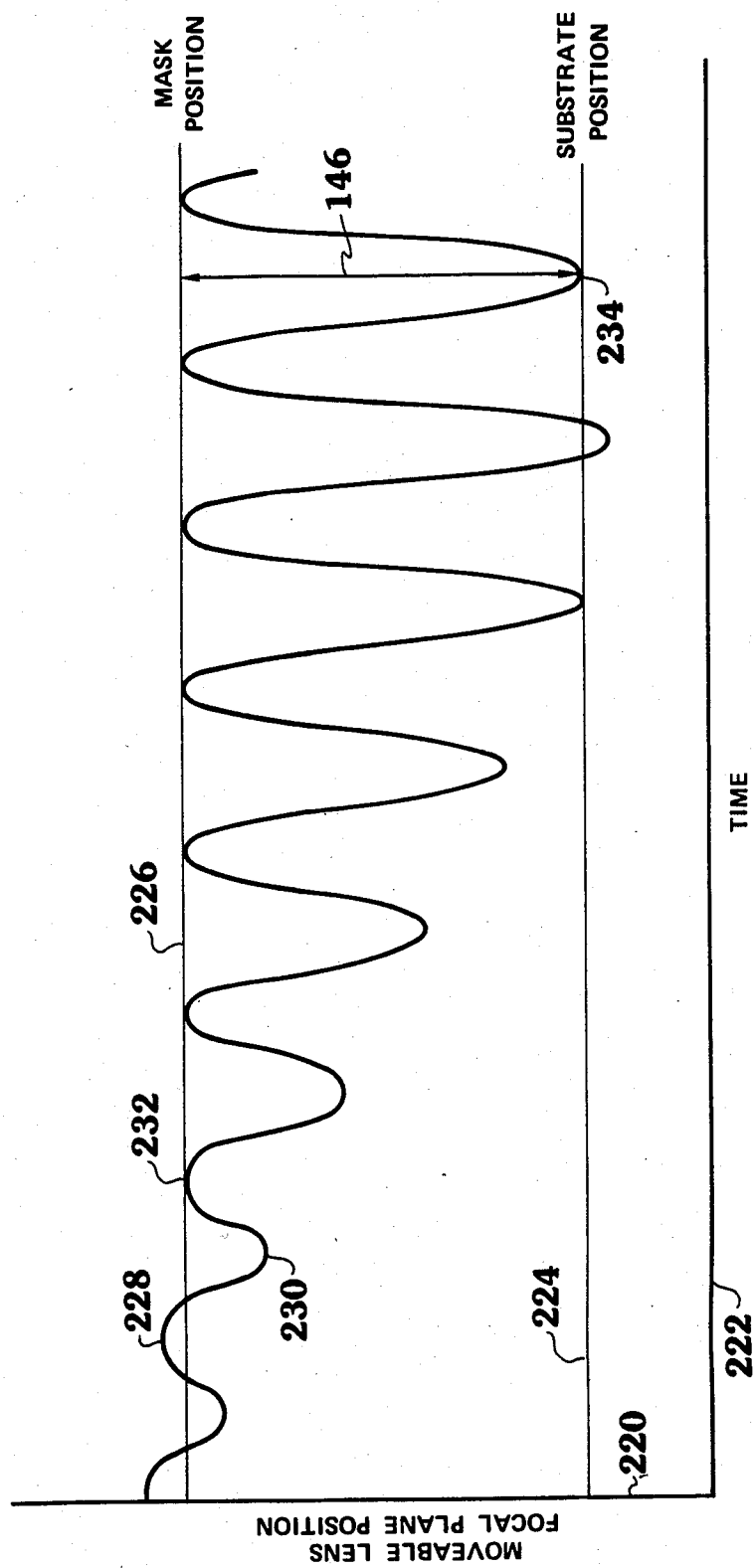
FIG. 7 is a diagram illustrating a method of gap measurement employed by the system of FIG. 1 to determine the separation distance between a mask and a spaced-apart substrate.

The method employed to determine the center of the depth of field of the optics will now be described with reference to FIG. 6, where the amplitude 190 of the differential signal between the high and low photodiode signals (produced by bright and dim areas of an image of the mask or the substrate) is plotted against moveable lens position 192. Each point 194 in this plot represents measurement of the amplitude of the differential signal for a complete scan of the photodiode array 36 (see FIG. 1). As the moveable lens position 192 is changed from left to right, the amplitude 190 of the measured differential signal increases from an unfocused level 180 to a focused level 178, remains constant at the focused level 178 throughout the depth of field 202 of the optics, and thereafter decreases back to the unfocused level 180. The center of the depth of field 202 is determined by employing a threshold differential signal 200 to establish a first threshold position 204 and a second threshold position 206. A center position 208 is calculated from the average of these two threshold positions.

The method of measuring the gap 146 separating the mask 10 and the substrate 14 will now be described with reference to FIGS. 1-4 and FIG. 7, where the moveable lens focal plane position 220 with respect to a mask position 226 and a spaced-apart substrate position 224 is plotted against time 222. Moveable lens 18 is driven to undergo a few positional oscillations 228 and 230 by the piezoelectric transducer 22 to establish a mask focus point 232. The magnitude of the moveable lens oscillations is then increased until a substrate focus point 234 is established. To measure the gap 146, the digital computer 99 first determines the piezo voltage signal that best positions an image of the mask 10 onto the photodiode array 36 (this piezo voltage signal corresponds to the mask focus point 232) and then determines the piezo voltage signal that best positions an image of the substrate 14 onto the photodiode array 36 (this piezo voltage signal corresponds to the substrate focus point 234). The digital computer 99 then converts these two piezo voltage signals into moveable lens positions by using a stored calibration conversion. The measured gap 146 is simply the difference between these lens positions and is displayed to the operator by employing the digital input/output port 106 to provide a status output signal 98.

The stored calibration conversion used to convert the piezo voltage signals to moveable lens positions is determined by employing the displacement transducer 52 (see FIG. 1), which is a linear voltage displacement transducer in the preferred embodiment of the present invention. This is accomplished by moving the substrate 14 and the moveable lens 18 to positions at which an image of the substrate 14 is best focused onto the photodiode array 36. The displacement transducer 52 directly measures substrate displacement and indirectly measures moveable lens displacement as long as the moveable lens 18 is moved with the substrate so as to remain in focus. By using this indirect measurement technique for moveable lens displacement, any hysteresis or non-linearity in moveable lens position as a function of piezo voltage signal may be measured and utilized to generate the calibration conversion, which is thereupon stored in RAM 112 for subsequent usage.

With reference now to FIGS. 1 and 4, the strobe flashing control function provided by the digital computer 99 and its associated interfacing will be described. Strobe light 46 is flashed each time a focus measurement is taken by simultaneously sending the strobe signal 78 and the start scan signal 88 through the digital output port 104. The flash duration is long enough to allow a complete scan of the photodiode array 36. Once the positional oscillations of the moveable lens 18 have been adjusted to provide a focused image of the mask 10 and the substrate 14, the strobe light 46 flashes at each oscillation peak. An observer 44 looking through the viewing lens assembly 38 will see magnified and superimposed images of both the mask 10 and the substrate 14 to aid in the alignment procedure. In the preferred embodiment of the present invention, the moveable lens 18 is oscillated at a rate of 40 Hz to provide flicker-free images for viewing.

Figure 8:
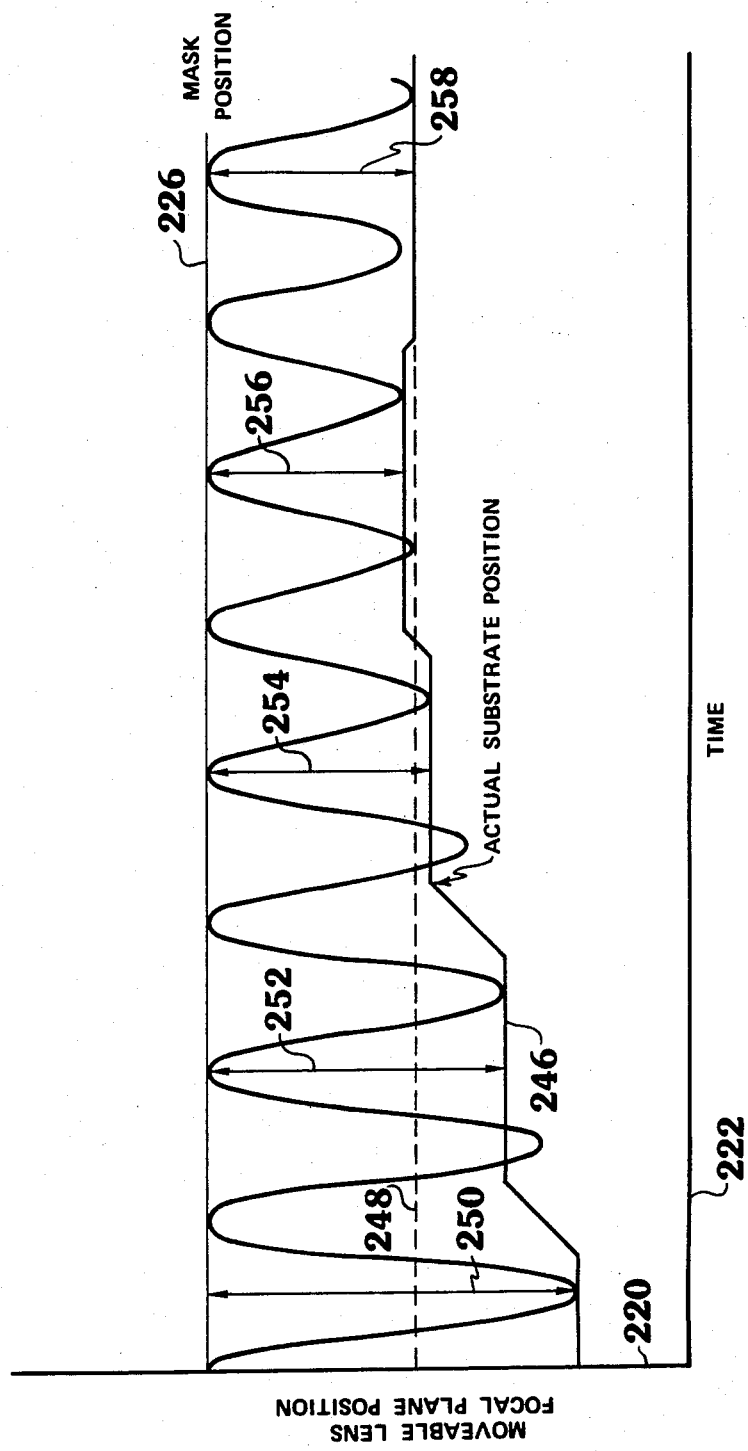
FIG. 8 is a diagram illustrating an interactive method of gap adjustment employed by the system of FIG. 1 to adjust the separation distance between a mask and a spaced-apart substrate to a predetermined value.

With reference now to FIGS. 1, 3, 4 and 8 the substrate positioning control function of the digital computer 99 and its associated interfacing will be described. The first phase of the substrate positioning control function is the adjustment of the gap 146 separating the mask 10 and the substrate 14 to a predetermined value. This is illustrated in FIG. 8, where the positional oscillations of the moveable lens 18 and the adjustment of an actual substrate position 246 with respect to a desired substrate position 248 are plotted against time 222. A first gap measurement 250 is made and compared by the digital computer 99 with a desired gap measurement 258. The substrate 14 is then moved in the Z direction 49 and a second gap measurement 252 is made and compared with the desired gap measurement 258. This process is repeated with a third gap measurement 254, a fourth gap measurement 256, and more gap measurements, if necessary, until the actual gap measurement equals the desired gap measurement 248.

Once the substrate 14 has been positioned the correct distance from the mask 10 (i.e., once the mask and the substrate are separated by the desired gap), the second phase of substrate positioning, or alignment, may begin. In the preferred embodiment, the operator views superimposed images of the mask 10 and the substrate 14 through the viewing lens assembly 38 and positions the substrate 14 by directing the digital computer 99, via the keyboard 92, to provide control signals for controlling movement of the stage 50 with the substrate 14 supported thereon. These control signals comprise the X motion signal 70, the Y motion signal 66 and the $\theta$ motion signal 62, which are provided at the digital output port 104 for directing the X, Y and Z stepper motors and controllers 68, 64 and 72, respectively, to move the stage 50. When the operator observes that corresponding alignment marks on the mask 10 and the substrate 14 are in proper alignment, the substrate 14 is properly positioned and ready for the next step in the photolithographic process.

The auto-focusing alignment and measurement system of the present invention can also be employed to measure the degree of flatness of the upper surface of the substrate 14. This measurement is made by positioning the moveable lens 18 at a succession of positions that best focus images of spaced-apart areas of the upper surface of the substrate 14 onto the photodiode array 36. These spaced-apart areas of the upper surface of substrate 14 are brought into the field of view of the focusing lens optics by moving the stage 50 in the X and Y directions 51 and 53, repectively. The degree of surface flatness of the upper surface of the substrate 14 is computed by the computer 99 from the range of moveable lens displacements effected to position the moveable lens 18 at the aforementioned succession of best-focus positions.

The auto-focusing alignment and measurement system of the present invention can be employed to measure the degree of parallelism between the lower surface of the mask 10 and the adjacent upper surface of the substrate 14 by moving the mask and the substrate together in the X and Y directions 51 and 53, respectively, and by measuring the gap 146 between those surfaces (see FIG. 3) at several different locations. Concomitantly, the upper surface of the substrate 14 can be adjusted to be parallel to the lower surface of the mask 10 by rotating the substrate in the γ and δ directions 57 and 59 about the orthogonal X and Y axes (which are both perpendicular to the optical axis 130 of the moveable lens 18) to a position that equalizes the gap measurements made at those different locations.

To facilitate moving the mask 10 and the substrate 14 together for determining the degree of parallelism between the adjacent surfaces thereof, the mask frame 12 can be selectively locked to the substrate holder 16 or the stage 50 as indicated by the dashed selectively-operable coupling 61 in FIG. 1. When so locked, the mask frame 12 moves together with the stage 50 in the X and Y directions 51 and 53. Once the gap measurements for determining the degree of parallelism between the adjacent surfaces of the mask 10 and the substrate 14 have been made, the mask frame 12 is unlocked from the substrate holder 16 and the stage 50. The substrate holder 16 may then be rotated relative to the mask frame 12 by the γ and δ stepper motor and controller 91 to position the upper surface of the substrate 14 parallel to the adjacent lower surface of the mask 10.

Figure 9:
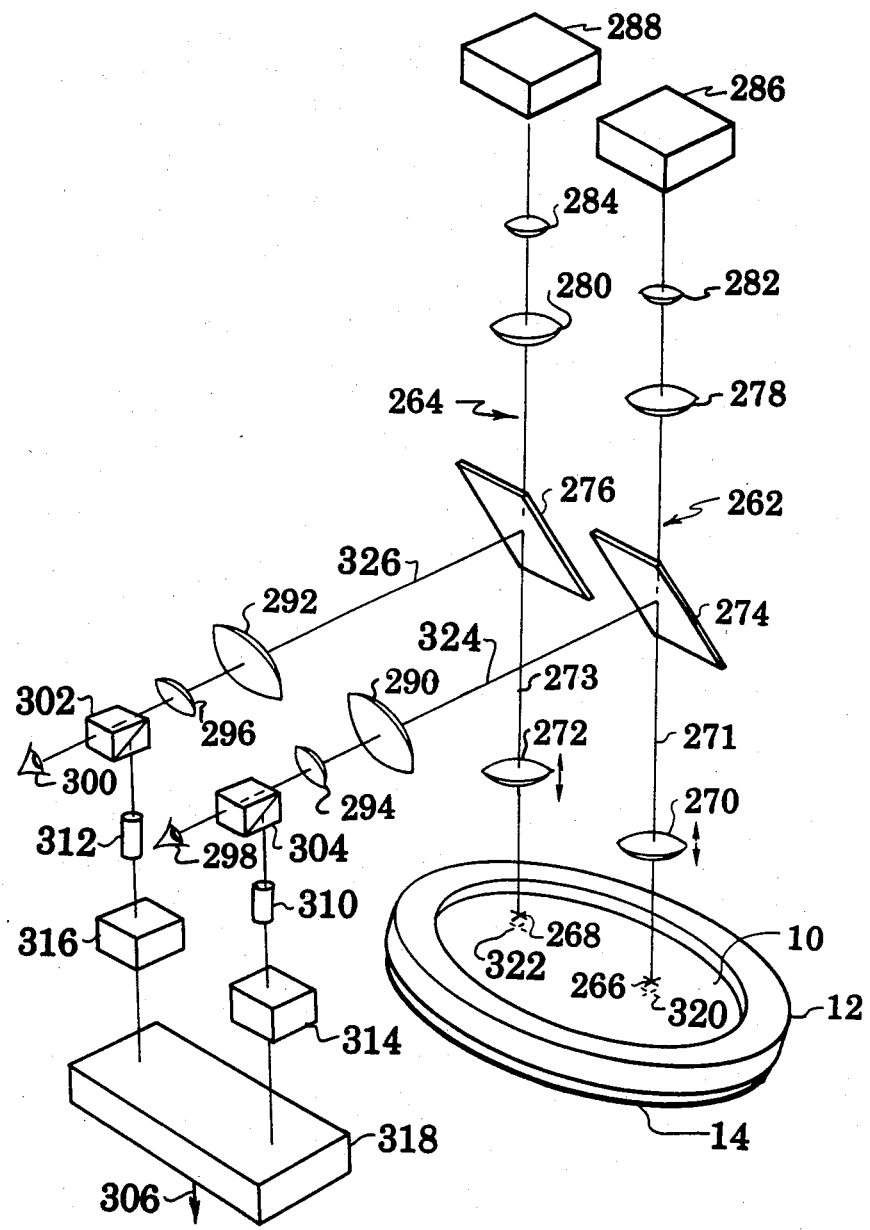
FIG. 9 is a schematic view of a binocular embodiment of the system of FIG. 1.

Referring now to FIG. 9, there is shown a binocular embodiment of the auto-focusing alignment and measurement system of the present invention that may be employed for faster alignment than the previously-described monocular embodiment. In this binocular embodiment, right and left focusing and viewing optics 262 and 264 provide the operator with a binocular view of spaced-apart right and left alignment marks 266 and 268, respectively, on the mask 10 held by the mask frame 12 and also of corresponding spaced-apart right and left alignment marks 320 and 322 on the substrate 14 supported beneath the mask. This enables the operator to visually check the alignment of the substrate 14 with respect to the mask 10 in the X, Y and θ directions without repositioning both the mask and the substrate to permit viewing of the spaced-apart, alignment-mark containing areas of the mask and the substrate as required in the case of the monocular embodiment.

Both the right and left focusing and viewing optics 262 and 264 of the binocular embodiment are of the same design and function in the same manner as in the previously-described monocular embodiment. Thus, right and left moveable lenses 270 and 272 are adapted for movement along parallel, vertical right and left focusing lens optical paths 271 and 273, respectively. A right beam splitter 274 is disposed in the vertical right focusing lens optical path 271 above the right moveable lens 270 for providing a horizontal right viewing lens optical path 324, and a left beam splitter 276 is similarly disposed in the vertical left focusing lens optical path 273 above the left moveable lens 272 for providing a horizontal left viewing lens optical path 326 parallel to the horizontal right viewing lens optical path. A right transfer lens 278 and a right focusing lens 282 are disposed along the vertical right focusing lens optical path 271 above the right beam splitter 274 to focus a magnified image of the right alignment mark containing area of the mask 10 or the substrate 14 onto a right focus detector 286 also disposed along the vertical right focusing lens optical path at the focal plane of the right focusing lens 282, while another right transfer lens 290 and another right focusing lens 294 are disposed along the horizontal right viewing lens optical path 324 to present a magnified and focused image of the same right alignment mark containing area to the operator's right eye 298. Similarly, a left transfer lens 280 and a left focusing lens 284 are disposed along the vertical left focusing optical path 273 above the left beam splitter 276 to focus a magnified image of the left alignment mark containing area of the mask 10 or the substrate 14 onto a left focus detector 288 also disposed along the vertical left focusing lens optical path at the focal plane of the left focusing lens 284, while another left transfer lens 292 and another left focusing lens 296 are disposed in the horizontal left viewing lens optical path 326 to present a magnified and focused image of the same left alignment mark containing area to the operator's left eye 300. This enables the operator to align the substrate 14 with respect to the mask 10 by aligning images of both the right and left alignment marks 320 and 322 on the substrate 14 with images of the corresponding right and left alignment marks 266 and 268 on the mask 10. Gap measurements made with each of the right and left focusing and viewing optics 262 and 264 are used to adjust the separation and parallelism between the mask 10 and the substrate 14.

In accordance with another embodiment of the present invention, also shown in FIG. 9, a right beam splitter 304 is disposed along the horizontal right viewing lens optical path 324 between the right focusing lens 294 and the operator's viewing station to additionally provide a vertical right viewing optical path, and a left beam splitter 302 is disposed along the horizontal left viewing lens optical path 326 between the left focusing lens 296 and the operator's viewing station to additionally provide a vertical left viewing optical path parallel to the vertical right viewing optical path. Right and left television cameras 310 and 312 are respectively disposed along the vertical right and left viewing optical paths for viewing the magnified and focused images of the right and left alignment mark containing areas of the mask 10 and the substrate 14. These right and left television cameras 310 and 312 are coupled by right and left television monitors 314 and 316, respectively, to an automatic alignment recognition system 318 well known in the prior art. With reference now also to FIG. 4, the output 306 of the automatic alignment recognition system 318 is coupled to the computer 99 via the analog to digital converter 102. In response to the automatic alignment recognition system 318, the computer 99 provides X, Y and θ motion control signals for effecting movement of the stage 50 to position the substrate 14 in alignment with respect to the mask 10.

In accordance with still another embodiment of the present invention, the viewing optics 38 of FIGS. 1 and 3 may be replaced with a television camera and a screen to provide the operator with a display of a magnified image of the mask 10 and the substrate 14. The two sets of viewing optics 290–296 of FIG. 9 may also be replaced with two television cameras and a screen to similarly provide the operator with a split-field display of a magnified and focused image of the right and left alignment mark containing areas of the mask 10 and the substrate 14.

Each of the moveable lenses 18, 270 and 272 employed in the previously-described embodiments of the present invention may comprise, for example, a Zeiss Epiplan 46-20-93 20× microscope objective lens driven sinusoidally at a frequency of 20Hz. The piezoelectric transducer 22 for moving or oscillating each moveable lens may comprise a Burleigh PZ-44, and the high voltage operational amplifier 80 for driving the piezoelectric transducer may comprise a Burleigh PZ-70. The focusing lenses 34, 42, 282, 284, 294 and 296 in the focusing lens and viewing lens assemblies of the previously-described embodiments may, for example, provide a 10× magnification. Each of the focus detectors 36, 286 and 288 employed in the previously-described embodiments preferably comprises a Reticon 1024G photodiode array with 0.001 inch spacing between photodiodes, while the associated signal conditioning circuit 84 preferably comprises a Reticon RC100B/RC106 signal conditioning circuit operable at a scan rate of 500 KHz. The strobe light 46 for illuminating the mask 10 and the substrate 14 may comprise a 15 watt xenon lamp with an ultraviolet filter, and the associated strobe power supply 76 may comprise an EG&G PS-302 power supply for pulsing the strobe light at 40 Hz with a pulse duration of 0.001 second.

We claim:

1. Apparatus for focusing on first and second spaced-apart object planes, said apparatus comprising:
   first imaging means, movably disposed along an optical axis, for providing a first focal plane disposed toward the first and second object planes;
   second imaging means, disposed along the optical axis on the opposite side of the first imaging means from the first and second object planes, for providing a second focal plane disposed away from the first and second object planes;
   illumination means for illuminating the first and second object planes;
   an array of photodiodes disposed along the optical axis at the second focal plane, each photodiode being operable for producing an electrical signal proportional to the intensity of light incident thereon;
   processing means, coupled to the array of photodiodes, for analyzing the signals therefrom to indicate the focus of images of the first and second object planes at the second focal plane; and
   control means, coupled to the precessing means, for oscillating the first imaging means along the optical axis to repetitively alternately position the first focal plane in coincidence with the first and second object planes and permit viewing of images of the first and second object planes in focus simultaneously.

2. Apparatus for positioning a first planar object with respect to a second planar object separated from the first planar object by a finite distance, said apparatus comprising:
   first imaging means, movably disposed along an optical axis, for providing a first focal plane disposed toward the planar object;
   second imaging means, disposed along the optical axis on the opposite side of the first imaging means from the planar objects, for providing a second focal plane disposed away from the planar objects;
   illumination means for illuminating the planar objects;
   an array of photodiodes disposed along the optical axis at the second focal plane, each photodiode being operable for producing an electrical signal proportional to the intensity of light incident thereon;
   processing means, coupled to the array of photodiodes, for analyzing the signals therefrom to indicate the focus of images of the planar objects; and
   control means, coupled to the processing means, for oscillating the first imaging means from one position to another along the optical axis to repetitively position the first focal plane alternately in coincidence with adjacent surfaces of the planar objects and permit viewing of images of those surfaces of the planar objects in focus simultaneously;
   said processing means also being operable for determining the displacement between the aforementioned positions of the first imaging means to determine the separation distance between the adjacent surfaces of the planar objects along the optical axis.

3. Apparatus as in claim 2 further comprisng:
   displacement means for moving the first planar object in a direction parallel to the optical axis; and
   control means, coupled to the displacement means, for adjusting the separation distance between the adjacent surfaces of the planar object to a preselected value.

4. Apparatus as in claim 2 further comprising:
   displacement means for moving the planar objects together in a plane perpendicular to the optical axis to allow determination of the separation distance between the adjacent surfaces of the planar objects at several locations; and
   rotation means for rotating the first planar object about orthogonal axes perpendicular to the optical axis to position the adjacent surfaces of the planar objects in parallel planes by equalizing the separation distances determined at the aforementioned locations.

5. Apparatus as in claim 3 or 4 further comprising:
   displacement means for translating and rotating the first planar object relative to the second planar object in a plane perpendicular to the optical axis;
   alignment sensing means for measuring the alignment between the two planar objects; and
   control means, coupled to the alignment sensing means and the last-mentioned displacement means, for controlling the translation and rotation of the first planar object to position the first planar object in alignment with respect to the second planar object.

6. Apparatus for aligning a semiconductor substrate with respect to a circuit mask separated from the substrate by a finite distance, said apparatus comprising:
   first imaging means, movably disposed along a first optical path, for providing a first focal plane disposed toward the mask and the substrate;
   second imaging means, disposed along the first optical path on the opposite side of the first imaging means from the mask and the substrate, for providing a second focal plane dipposed away from the mask and the substrate;
   beam splitting means, disposed along the first optical path between the first imaging means and the second imaging means, for providing a second optical path;
   third imaging means, disposed along thesecond optical path, for providing an image of the mask and the substrate;
   illumination means for illuminating the mask and the substrate;
   an array of photodiodes disposed along the first optical path at the second focal plane, each photodiode being operable for producing an electrical signal proportional to the intensity of light incident thereon;
   processing means, coupled to the array of photodiodes, for analyzing the signals therefrom to indicate the focus of images of the mask and the substrate; and control means, coupled to the processing means, for oscillating the first imaging means from one position to another along the first optical path to repetitively position the first focal plane alternately in coincidence with a surface of the mask and an adjacent surface of the substrate and permit viewing of images of those surfaces of the mask and the substrate in focus simultaneously.

7. Apparatus as in claim 6 wherein the illumination means is coupled to the processing means and responsive thereto for illuminating the aforementioned surface of the mask when that surface is in coincidence with the first focal plane and for illuminating the aforementioned adjacent surface of the substrate when that surface is in coincidence with the first focal plane.

8. Apparatus as in claim 8 further comprising first substrate displacement means for translating and rotating the substrate relative to the mask in a plane parallel to the first focal plane to move the substrate into alignment with respect to the mask.

9. Apparatus as in claim 8 wherein the processing means is operable for determining the displacement between the aforementioned positions of the first imaging means to determine the separation distance between the aforementioned adjacent surfaces of the mask and the substrate along the first optical path.

10. Apparatus as in claim 9 further comprising:
second substrate displacement means for moving the substrate in a direction perpendicular to the first focal plane; and
control means, coupled to the second substrate displacement means and the processing means, for adjusting the separation distance between the aforementioned adjacent surfaces of the mask and the substrate to a preselected value.

11. Apparatus for aligning a semiconductor substrate with respect to a circuit mask separated from the substrate by a finite distance, said apparatus comprising:
right first imaging means, movably disposed along a right first optical path, for providing a right first focal plane disposed toward the mask and the substrate;
left first imaging means, movably disposed along a left first optical path parallel to the right first optical path, for providing a left first focal plane disposed toward the mask and the substrate;
right second imaging means, disposed along the right first optical path on the opposite side of the right first imaging means from the mask and the substrate, for providing a right second focal plane disposed away from the mask and the substrate;
left second imaging means, disposed along the left first optical path on the opposite side of the left first imaging means from the mask and the substrate, for providing a left second focal plane disposed away from the mask and the substrate;
right beam splitting means, disposed along the right first optical path between the right first imaging means and the right second imaging means, for providing a right second optical path separate from the right first optical path;
left beam splitting means, disposed along the left first optical path between the left first imaging means and the left second imaging means, for providing a left second optical path separate from the left first optical path;
right third imaging means, disposed along the right second optical path, for providing an image of a right area of a surface of the mask and a corresponding right area of an adjacent surface of the substrate;
left third imaging means, disposed along the left second optical path, for providing an image of a left area of a surface of the mask and a corresponding left area of an adjacent surface of the substrate;
right illumination means for illuminating the right surface areas of the mask and the substrate;
left illumination means for illuminating the left surface areas of the mask and the substrate;
a right array of photodiodes disposed along the right first optical path at the right second focal plane, each of those photodiodes being operable for producing an electrical signal proportional to the intensity of light incident thereon;
a left array of photodiodes disposed along the left first optical path at the left second focal plane, each of those photodiodes also being operable for producing an electrical signal proportional to the intensity of light incident thereon;
processing means, coupled to the right and left arrays of photodiodes, for analyzing the signals from the right array of photodiodes to indicate the focus of images of the right surface areas of the mask and the substrate and for analyzing the signals from the left array of photodiodes to indicate the focus of images of the left surface areas of the mask and the substrate;
right control means, coupled to the processing means, for oscillating the right first imaging means from one position to another along the right first optical path to repetitively position the right first focal plane alternately in coincidence with the corresponding right surface areas of the mask and the substrate and permit viewing of images of those corresponding right surface areas in focus simultaneously; and
left control means, coupled to the processing means, for oscillating the left first imaging means from one position to another along the left first optical path to repetitively position the left first focal plane alternately in coincidence with the corresponding left surface areas of the mask and the substrate and permit viewing of images of those corresponding left surface areas in focus simultaneously.

12. Apparatus as in claim 11 wherein:
the right illumination means is coupled to the processing means and responsive thereto for illuminating the right surface area of the mask when that surface area is in coincidence with the right first focal plane and for illuminating the right surface area of the substrate when that surface area is in coincidence with the right first focal plane; and
the left illumination means is also coupled to the processing means and responsive thereto for illuminating the left surface area of the mask when that surface area is in coincidence with the left first focal plane and for illuminating the left surface area of the substrate when that surface area is in coincidence with the left first focal plane.

13. Apparatus as in claim 12 further comprising first substrate displacement means for translating and rotating the substrate relative to the mask in a plane perpendicular to the right and left first optical paths to move the substrate into alignment with respect to the mask.

14. Apparatus as in claim 13 wherein the processing means is operable for determining the displacement between the aforementioned positions of the right first imaging means to determine the right separation distance between the corresponding right surface areas of the mask and the substrate and for determining the displacement between the aforementioned positions of the left first imaging means to determine the left separation distance between the corresponding left surface areas of the mask and the substrate;

second substrate displacement means for rotating the substrate about an axis perpendicular to the right and left first optical paths; and control means, coupled to the second substrate displacement means and the processing means, for positioning the substrate to equalize the right and left separation distances.

15. Apparatus as in any one of the preceding claims 1, 2, 6 and 11 wherein each first imaging means comprises a single convergent lens.

16. Apparatus as in claim 15 wherein each second imaging means comprises a convergent lens.

17. Apparatus as in claim 16 wherein each second imaging means further comprises a convergent magnifying lens.

18. Apparatus as in any one of the preceding claims 1, 2, 6 and 11 wherein each control means comprises:

a piezoelectric transducer, coupled to the respective first imaging means, for displacing that first imaging means in proportion to the magnitude of an applied voltage; and drive means, coupled to the piezoelectric transducer and the processing means, for driving the piezoelectric transducer with an applied voltage of a magnitude for effecting displacement of the respective first imaging means to a position at which the processing means indicates focus of an image.

19. Apparatus as in claim 6 or 11 wherein each third imaging means comprises first and second convergent lenses for providing a focused and magnified view of the mask and the substrate.

20. Apparatus as in claim 6 or 11 wherein each third imaging means comprises a television camera and an associated television monitor for providing a focused and magnified view of the mask and the substrate.

21. Apparatus as in claim 6 or 11 wherein each illumination means comprises a strobe light timed to flash when the first focal plane coincides with the aforementioned surface of the mask or the aforementioned adjacent surface of the substrate.

22. Apparatus as in any one of the preceding claims 1, 6 and 11 wherein the processing means is responsive to the rate of signal transition from photodiodes sensing a relatively light area of an image to photodiodes sensing a relatively dark area of the same image in determining the focus of that image.

23. Apparatus as in any one of the preceding claims 1, 2, 7 and 11 wherein the processing means is responsive to the difference in signal strength from photodiodes sensing a relatively light area of an image and from photodiodes sensing a relatively dark area of the same image in determining the focus of that image.

24. A method of positioning a first planar object in alignment with respect to a second planar object, said method comprising the steps of:

oscillating a first optical lens along its optical axis such that images of the first and second planar objects are repetitively alternately focused onto an array of photodiodes located at a focal plane of a second optical lens to permit viewing of those images simultaneously;

illuminating the first planar object only when its image is focused onto the array of photodiodes at the focal plane of the second optical lens, and illuminating the second planar object only when its image is focused onto the array of photodiodes at the focal plane of the second optical lens;

observing the images of both the first and second planar objects simultaneously; and moving the first planar object in a plane perpendicular to the optical axis of the first optical lens to position the first planar object in alignment with respect to the second planar object as indicated by alignment of the images of both the first and second planar objects.

25. A method as in claim 24 further comprising the step of measuring the displacement of the first optical lens from a position at which the image of the first planar object is focused onto the array of photodiodes at the focal plane of the second optical lens to a postion at which the image of the second planar object is focused onto the array of photodiodes at the focal plane of the second optical lens to determine the separation distance between the first and second planar objects.

26. A method as in claim 25 further comprising the step of moving the first planar object in a direction parallel to the optical axis of the first optical lens to adjust the separation distance between the first and second planar objects to a preselected value.

27. A method as in claim 25 or 26 further comprising the steps of:

measuring the separation distance between the first and second planar objects at a plurality of spaced-apart locations; and rotating the first planar object about orthogonal axes perpendicular to the optical axis of the first optical lens to equalize the separation distances measured at the aforementioned locations.

28. A method of projecting a composite image of a first planar object and a second planar object to an image plane, said method comprising the steps of:

oscillating a first optical lens along its optical axis such that images of the first and second planar objects are repetitively alternately focused through a second optical lens onto an array of photodiodes at the image plane to permit viewing of those images simultaneously; and illuminating the first planar object only when its image is focused onto the array of photodiodes at the image plane, and illuminating the second planar object only when its image is focused onto the array of photodiodes at the image plane.

29. A method as in claim 24, 25, 26 or 28 wherein:

the first planar object comprises a semiconductor substrate; and the second planar object comprises a circuit mask.

* * * * *